(12) United States Patent
Kawahara et al.

(10) Patent No.: US 6,537,012 B2
(45) Date of Patent: Mar. 25, 2003

(54) VACUUM PROCESSING APPARATUS AND A VACUUM PROCESSING SYSTEM

(75) Inventors: Hironobu Kawahara, Kudamatsu (JP);
Mitsuru Suehiro, Kudamatsu (JP);
Kazue Takahashi, Kudamatsu (JP);
Hideyuki Yamamoto, Kudamatsu (JP);
Katsuya Watanabe, Kudamatsu (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/086,709

(22) Filed: Mar. 4, 2002

(65) Prior Publication Data

US 2002/0081175 A1 Jun. 27, 2002

Related U.S. Application Data

(62) Division of application No. 09/697,324, filed on Oct. 27, 2000.

(30) Foreign Application Priority Data

Oct. 29, 1999 (JP) .......................................... 11-307997

(51) Int. Cl.$^7$ ...................... H01L 21/3065; B65G 49/07
(52) U.S. Cl. ...................... 414/217; 414/935; 414/939
(58) Field of Search ............................... 414/217, 939, 414/935

(56) References Cited

U.S. PATENT DOCUMENTS

| 5,102,496 A | * | 4/1992 | Savas .......................... 156/643 |
| 5,314,509 A | | 5/1994 | Kato et al. |
| 5,784,799 A | * | 7/1998 | Kato et al. ........................ 34/92 |
| 5,934,856 A | * | 8/1999 | Asakawa et al. ............ 414/217 |
| 5,946,184 A | * | 8/1999 | Kanno et al. ................. 361/234 |
| 5,980,684 A | | 11/1999 | Hori et al. .................... 156/345 |
| 6,244,811 B1 | | 6/2001 | Kroeker et al. .............. 414/217 |
| 6,385,503 B2 | * | 5/2002 | Volle ........................... 700/218 |

FOREIGN PATENT DOCUMENTS

| JP | 61-8153 | 3/1986 |
| JP | 63-133532 | 6/1988 |
| JP | 6-30369 | 4/1994 |
| JP | 6-314729 | 11/1994 |
| JP | 6-314730 | 11/1994 |

* cited by examiner

*Primary Examiner*—Steven A. Bratlie
(74) *Attorney, Agent, or Firm*—Antonelli, Terry, Stout & Kraus LLP

(57) ABSTRACT

The vacuum processing apparatus has an atmospheric loader having a plurality of cassette tables and a transport unit for carrying wafers, a vacuum loader equipped with vacuum wafer-processing chambers and a vacuum transport chamber communicating with the processing chambers via gate valves, and a locking unit provided with a loading lock chamber and unloading lock chambers that have gate valves for connecting the atmospheric transport unit and vacuum transport chamber; wherein two etching chambers, formed by UHF-ECR reactors, are arranged symmetrically with respect to an axial line passing through the middle of the vacuum transport chamber and locking unit, only at the opposite side of the locking unit across the vacuum transport chamber, and at an acute angle with respect to the vacuum transport chamber, and UHF-ECR antennas, almost parallel to the foregoing axial line, are opened at the opposite side to that of the vacuum transport chamber.

1 Claim, 8 Drawing Sheets

VACUUM PROCESSING APPARATUS AND A VACUUM PROCESSING SYSTEM

This application is a Divisional application of application Ser. No. 09/697,324, filed Oct. 27, 2000.

BACKGROUND OF THE INVENTION

The present invention relates to vacuum processing apparatuses, and, more particularly, to a vacuum processing apparatus suitable for providing samples, namely, silicon substrates and the like, with single-wafer processing, such as etching, CVD (chemical vapor deposition), spattering, ashing, or rinsing, and to semiconductor manufacturing equipment using such a vacuum processing apparatus.

Vacuum processing apparatuses for processing samples can be broadly divided into a cassette block type and a vacuum processing block type. The cassette block type has its front extending longitudinally with respect to the bay passageway of semiconductor manufacturing equipment and includes cassette-and-sample orientation alignment units and atmospheric robots; whereas, the vacuum processing block type has a loading lock chamber, an unloading lock chamber, vacuum processing chambers, vacuum post-processing chambers, vacuum pumps, vacuum robots, and the like.

According to the abovementioned equipment, for a corresponding vacuum processing apparatus, the samples within a cassette are each carried from the cassette block to the loading lock chamber of the vacuum processing block by an atmospheric robot. The sample is further transferred from the loading lock chamber to a processing chamber by a vacuum robot, and then, after being set on an electrode structure, the sample undergoes plasma etching or other similar processing. The sample, after being processed, is transported to and further processed in a vacuum post-processing chamber, as required.

Examples of vacuum processing apparatuses for etching samples with plasma are disclosed in, for example, Patent Disclosure Collection 1986—official Gazette Issue No. 8153, Patent Disclosure Collection 1988—Official Gazette Issue No. 133532, Patent Disclosure Collection 1994—Official Gazette Issue No. 30369, Patent Disclosure Collection 1994—Official Gazette Issue No. 314729, Patent Disclosure Collection 1994—Official Gazette Issue No. 314730, and U.S. Pat. Nos. 5,314,509 and 5,784,799.

Vacuum processing apparatus based on the above-identified prior art has a concentric or rectangular arrangement of processing chambers and loading/unloading lock chambers. For example, the apparatus set forth in U.S. Pat. No. 5,314,509 has a vacuum robot located near the center of the vacuum processing block, with three processing chambers concentrically arranged around the robot and a loading lock chamber and an unloading lock chamber provided between the robot and the cassette block. Such apparatus has the problem that the transport arms of the atmospheric robot and vacuum robot have too wide a rotational angle range, and, thus, that the entire apparatus requires a large floor space.

At the same time, the processing chambers, vacuum pumps, and other piped/tubed units within the vacuum processing block of the vacuum processing apparatus require periodic and non-periodic maintenance, such as checking and repairing. Accordingly, around the vacuum processing block there are usually provided access doors to enable the maintenance of the loading lock chamber, unloading lock chamber, processing chambers, vacuum robots, and various piped/tubed units.

Conventional vacuum processing apparatus can handle samples up to 8 inches (about 200 mm) in diameter and not more than about 250 mm in cassette width "Cw". Even this cassette dimension, however, has the problem that a large floor space is required. In addition, to allow for handling larger samples, such as 12 inches (about 300 mm) in diameter "d", since carrier pods are required, the cassette width "Cw" must be increased to about 350 mm and the cassette block for storing multiple carrier pods must also be increased in width. If the width of the vacuum processing block is to be determined according to such width of the cassette block, the entire vacuum processing apparatus will require a larger floor space. For example, in the case of a cassette block capable of accommodating four carrier pods, if the diameter "d" of the samples is increased from the conventional 8 inches to 12 inches, cassettes will absolutely need to be at least about 40 cm wide.

For general semiconductor manufacturing equipment, to ensure that a large number of samples undergo various types of processing at the same time, multiple sets of a vacuum processing apparatus which carry out the same type of processing are located at one bay and samples are carried between bays automatically or manually. Since such manufacturing equipment requires a high degree of cleanliness, the entire equipment is installed in a large cleanroom. Increases in the dimensions of a vacuum processing apparatus, associated with increases in sample diameter, result in an increased cleanroom-occupied floor area, which in turn leads to further increased construction costs for a cleanroom, which is already high in construction costs. If multiple sets of a vacuum processing apparatus occupying a large floor area are to be installed in cleanrooms of the same area, the number of vacuum processing apparatus sets or the spacing between each set of the vacuum processing apparatus must be reduced. Reduction in the number of vacuum processing apparatus sets installed in cleanrooms of the same area will necessarily reduce the productivity of the semiconductor manufacturing equipment and thus increase semiconductor manufacturing costs. Reduction in the spacing between each set of the vacuum processing apparatus results in shortage of the maintenance space required for check and repair services, thereby deteriorating the maintainability of the vacuum processing apparatus significantly.

SUMMARY OF THE INVENTION

One object of the present invention is to provide a vacuum processing apparatus that can minimize its manufacturing costs while at the same time providing flexibility to increases in sample diameter.

Another object of the present invention is to provide a vacuum processing apparatus which is excellent in maintainability and is flexible to increases in sample diameter.

Still another object of the present invention is to provide a vacuum processing apparatus, such as semiconductor manufacturing equipment, that can minimize its manufacturing costs while at the same time provide flexibility to increases in sample diameter and ensure a complement of vacuum processing apparatuses, and which does not deteriorate maintainability.

The present invention is directed to a vacuum processing apparatus having an atmospheric loader equipped with a plurality of cassette tables arranged close to each other, and with a transport unit for carrying wafers from or to the cassette tables, a vacuum loader equipped with vacuum wafer-processing chambers and with a vacuum transport chamber in communication with the processing chambers via gate valves, and a locking unit that includes loading and unloading lock chambers equipped with gate valves for connecting the foregoing atmospheric transport unit and vacuum transport chamber;

wherein two vacuum wafer-processing chambers, both formed by a magnetized UHF-band electromagnetic wave radiation/discharge reactor (hereinafter, referred to as the UHF-ECR reactor), have side wall inner units and antennas so mounted as to permit disassembly, and they are arranged symmetrically with respect to an axial line passing through the middle of the vacuum transport chamber and locking unit, only at the opposite side of the locking unit across the vacuum transport chamber, and in such a manner that the vacuum processing chambers form an acute angle with respect to the vacuum transport chamber.

The present invention is directed to a vacuum processing apparatus having an atmospheric loader equipped with a plurality of cassette tables arranged close to each other, and with a transport unit for carrying wafers from or to the cassette tables, a vacuum loader equipped with vacuum wafer-processing chambers and with a vacuum transport chamber in communication with the processing chambers via gate valves, and a locking unit that includes loading and unloading lock chambers equipped with gate valves for connecting the foregoing atmospheric transport unit and vacuum transport chamber;

wherein two vacuum wafer-processing chambers, both formed by the UHF-ECR reactor, are arranged symmetrically with respect to an axial line passing through the middle of the vacuum transport chamber and locking unit, only at the opposite side of the locking unit across the vacuum transport chamber, and at an acute angle with respect to the vacuum transport chamber, and the antennas of the UHF-ECR reactor are directed almost in parallel to the aforementioned axial line and are opened at the opposite side of the vacuum transport chamber.

The present invention is directed to a vacuum processing apparatus having an atmospheric loader equipped with a plurality of cassette tables arranged close to each other, and with a transport unit for carrying wafers from or to the cassette tables, a vacuum loader equipped with vacuum wafer-processing chambers and with a vacuum transport chamber in communication with the processing chambers via gate valves, and a locking unit with loading and unloading lock chambers gate-valved for connecting the foregoing atmospheric transport unit and vacuum transport chamber;

wherein two vacuum wafer-processing chambers, both formed by the UHF-ECR reactor, have side wall inner units and antennas so mounted as to permit disassembly, and are arranged symmetrically with respect to an axial line passing through the middle of the vacuum transport chamber and locking unit, only at the opposite side of the locking unit across the vacuum transport chamber, and at an acute angle with respect to the vacuum transport chamber, and the aforementioned atmospheric loader, vacuum loader, and locking unit are arranged into a T-shape.

The present invention is directed to a vacuum processing system having multiple sets of vacuum processing apparatuses arranged in parallel, each set of which further consists of an atmospheric loader equipped with a plurality of cassette tables arranged close to each other, and with a transport unit for carrying wafers from or to the cassette tables, a vacuum loader equipped with vacuum wafer-processing chambers and with a vacuum transport chamber in communication with the processing chambers via gate valves, and a locking unit that includes loading and unloading lock chambers equipped with gate valves for connecting the foregoing atmospheric transport unit and vacuum transport chamber;

wherein two vacuum wafer-processing chambers, both formed by the UHF-ECR reactor, are arranged symmetrically with respect to an axial line passing through the middle of the vacuum transport chamber and locking unit, only at the opposite side of the locking unit across the vacuum transport chamber, and at an acute angle with respect to the vacuum transport chamber, and the vacuum processing apparatus sets arranged in parallel have all their vacuum processing chambers arranged linearly.

According to the present invention, it is possible to minimize increases in manufacturing costs, while at the same time providing flexibility to increases in sample size, and to provide a vacuum processing apparatus which is excellent in maintainability. Also, incorporation of such vacuum processing apparatus into semiconductor manufacturing equipment makes it possible to ensure the complement of vacuum processing apparatus and minimize manufacturing costs, while at the same time providing flexibility to increases in sample size, and to supply semiconductor manufacturing equipment whose maintainability does not deteriorate.

Furthermore, according to the present invention, one portion of the vacuum vessel constituting the processing chambers can be constructed as a section that can be opened and closed, and when this section directs the processing chambers upward, components can be maintained in their physically stable status at the operator side in an almost horizontal position by friction or by a securing section. Accordingly, since the top of the processing chambers opens in the direction of the maintenance area, maintenance personnel can easily both access the processing chambers and perform maintenance operations from the top. As a result, the maintenance personnel can easily handle components during maintenance, whereby maintainability is improved, which in turn enables the realization of a plasma processing apparatus which is excellent in maintainability and the ease of operations and contributes to an improvement of the productivity.

DETAILED DESCRIPTION OF PREFERRED EMBODIMENTS

Embodiments of the present invention will be described hereunder with reference to the accompanying figures.

Figure 1:
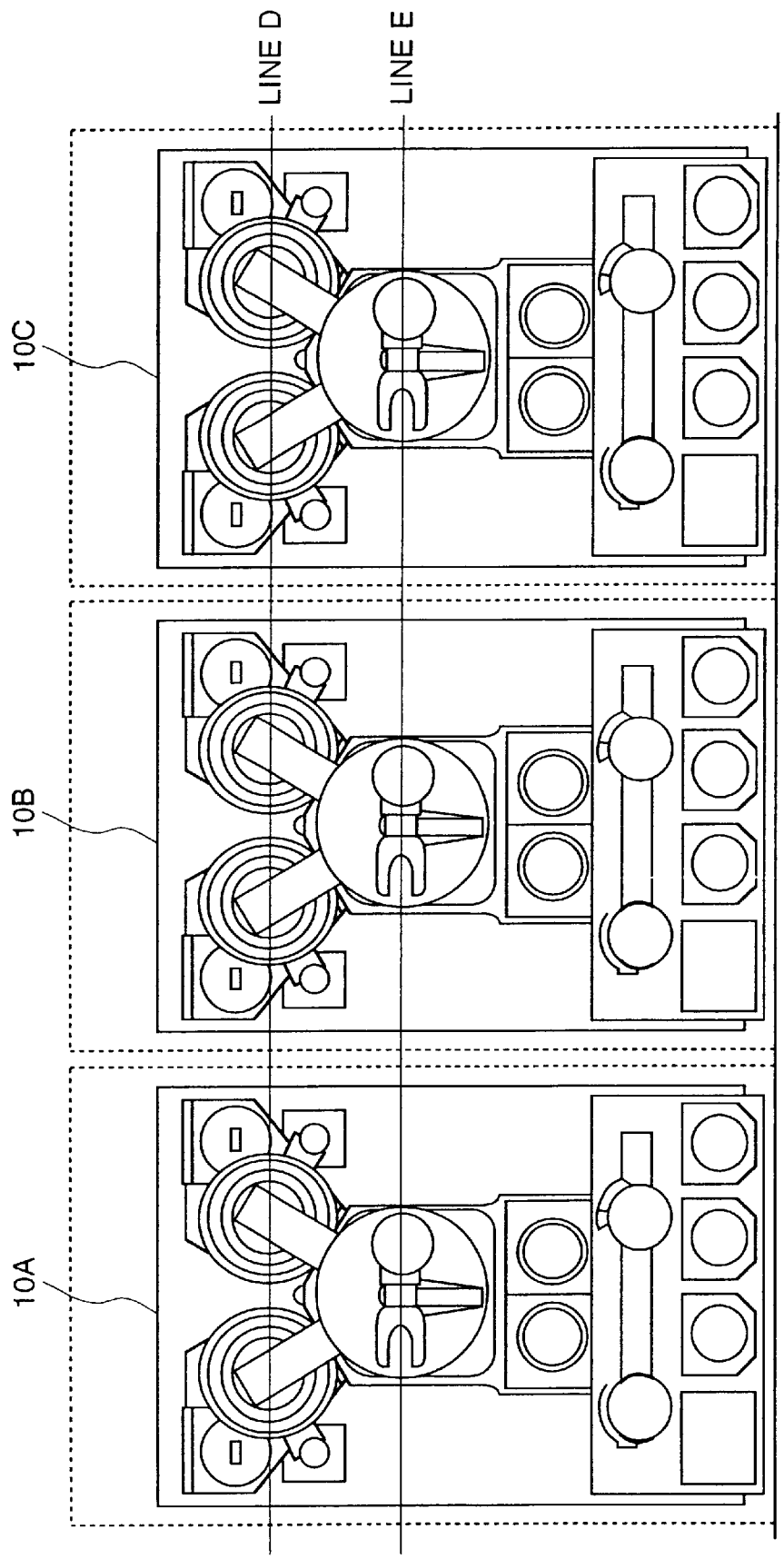
FIG. 1 is a conceptual diagram of an embodiment of a vacuum processing system according to the present invention.

FIG. 1 shows a connected arrangement of three sets of vacuum processing apparatus 10, which represents one embodiment of the present invention. The three apparatus sets are shown as 10A, 10B, and 10C.

Figure 2:
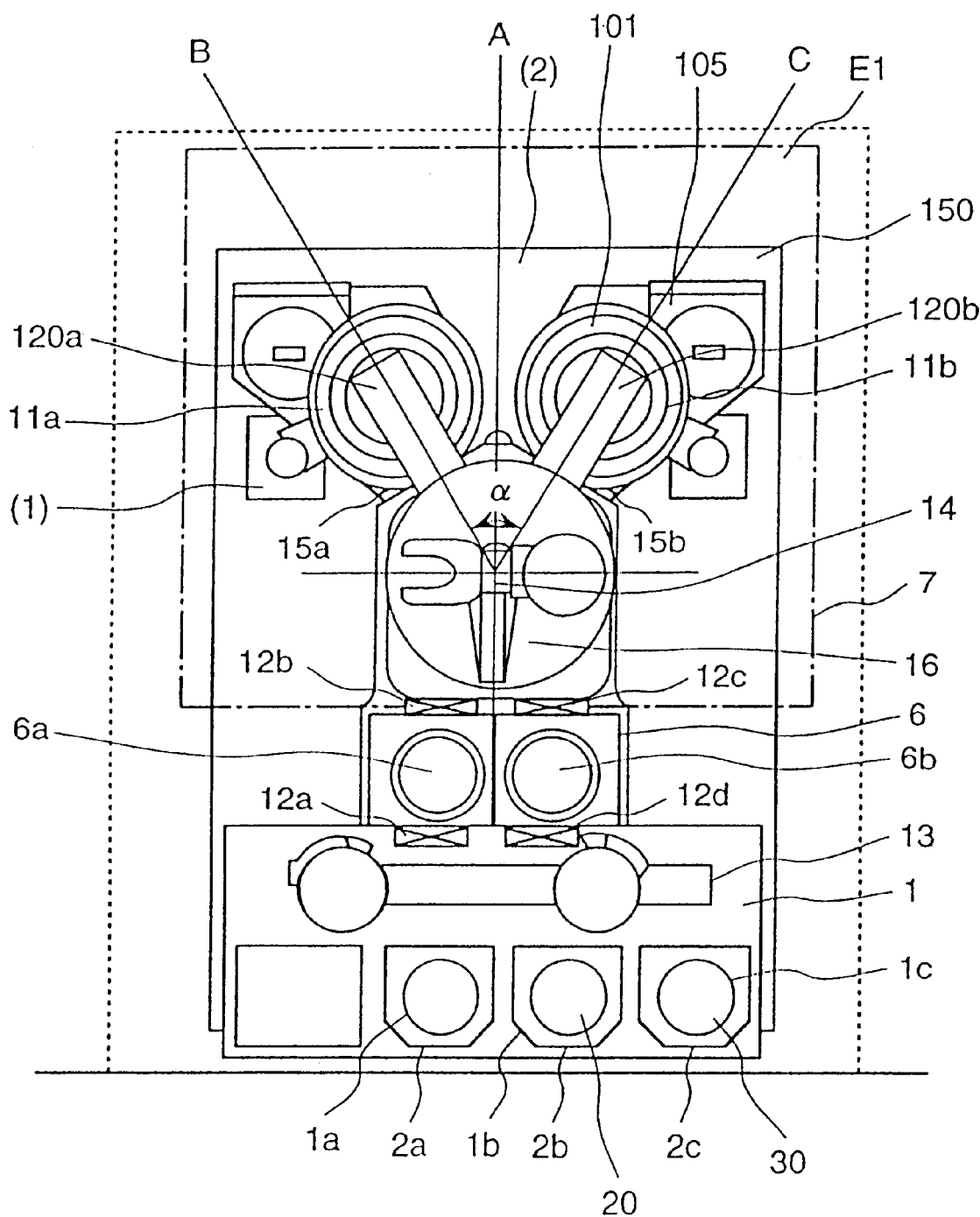
FIG. 2 is a conceptual diagram showing the basic configuration of one example of a vacuum processing apparatus according to the present invention.
Figure 3:
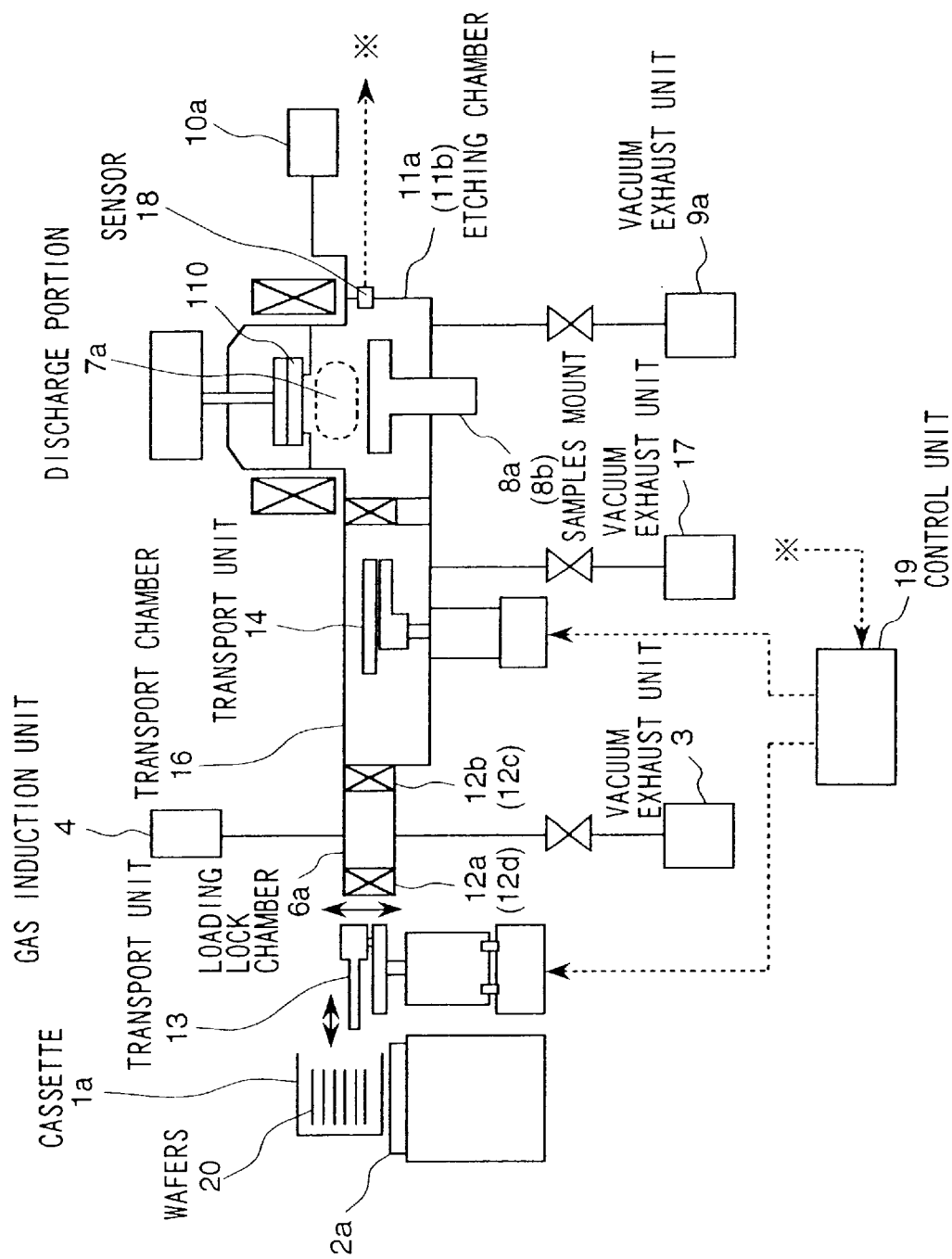
FIG. 3 is a schematic diagram of a side view of the apparatus shown in FIG. 2.

Prior to description of the vacuum processing system shown in FIG. 1, a description will be given of the vacuum processing apparatus, based on FIGS. 2 to 4. FIG. 2 is a conceptual block diagram of the aforementioned embodiment of the vacuum processing apparatus according to the present invention, and FIG. 3 is a schematic diagram of this apparatus. The vacuum processing apparatus shown in these figures, as one embodiment of the present invention, is a dry etching apparatus that uses gas plasma to etch the wafer to be processed. In the figures, vacuum processing apparatus 10 comprises atmospheric loader 1 equipped with a transport unit for carrying the wafers within cassettes 1a, 1b, and 1c, from a plurality of mutually adjacent cassette tables 2a, 2b, and 2c, or to cassette tables 2a, 2b, and 2c; vacuum loader 7 equipped with vacuum wafer-processing chambers (etching chambers) 11a and 11b, and with vacuum transport chamber 16 which communicates with the processing chambers via gate valves 15a and 15b; and locking unit 6 that includes loading lock chamber 6a and unloading lock chamber 6b, both equipped with a gate valve for connecting the atmospheric transport unit and vacuum transport chamber.

In this embodiment, cassette tables 2a or 2c are arranged in parallel and they always hold cassettes 1a or 1c in a position from which they can be loaded/unloaded, more specifically, a fixed position on an almost horizontal plane, without the original positions or directions of the cassette tables being disturbed. Cassette tables 2a and 2b are arranged next to one another in parallel. Cassette table 2c is located at the rightmost end of tables 2a and 2b. Both cassettes 1a and 1b are used for accommodating unprocessed or processed wafers and have a storage capacity of multiple wafers (usually, 25 pieces). In this case, cassette 1c is for accommodating the dummy wafers to undergo dry cleaning with plasma (hereinafter, referred to as plasma cleaning) or for collecting plasma-cleaned dummy wafers, and has a storage capacity of multiple wafers (usually, 25 pieces).

Loading lock chamber 6a and unloading lock chamber 6b that face cassette tables 2a and 2b, respectively, are arranged inside atmospheric loader 1, and transport unit 13 is located between cassette tables 2a/2b and lock chambers 6a/6b. Loading lock chamber 6a has vacuum exhaust unit 3 and gas induction unit 4 and can load unprocessed wafers into vacuum loader 7 via gate valve 12a. Unloading lock chamber 6b, likewise, has vacuum exhaust unit 3 and gas induction unit 4, and can take processed wafers out into atmospheric loader 1 via gate valve 12b. Transport unit 13 has a robot equipped with X-, Y-, Z- and theta-axes, and operates to enable wafers 20 to be exchanged between lock chambers 6a/6b and cassettes 1a/1b and between lock chambers 6a/6b and cassette 1c.

Loading lock chamber 6a and unloading lock chamber 6b are connected to vacuum transport chamber 16 via gate valves 12b and 12c, respectively. In this case, vacuum transport chamber 16 is circular and etching chambers 11a and 11b for vacuum processing are provided on both side walls of vacuum transport chamber 16 via gate valves 15a and 15b. The etching chambers are described below as an example. Inside vacuum transport chamber 16 there is provided a transport unit 14 that operates to enable wafers 20 or dummy wafers 30 to be exchanged between loading lock chamber 6a, unloading lock chamber 6b, and etching chambers 11a and 11b. Vacuum transport chamber 16 has also a vacuum exhaust unit 17 which is capable of exhausting vacuum independently.

In this case, etching chambers 11a and 11b of the UHF-ECR reactor are symmetrically arranged with the same configuration so as to enable etching. Etching chamber 11a is described below as an example. Etching chamber 11a has a samples mount 8a for placing wafers 20 and is also provided with a discharge chamber so that discharge portion 7a is formed above samples mount 8a. Etching chamber 11a has gas induction unit 10a for supplying a processing gas to discharge portion 7a, and is also provided with vacuum exhaust unit 9a for reducing the internal pressure of this etching chamber to the required level. In addition, etching chamber 11a has a means for generating, in this case, UHF waves and magnetic fields for converting into plasma the processing gas to be supplied to discharge portion 7a.

In this case, the etching chamber contains sensor 18 that measures plasma light emission intensity. The value that has been measured by sensor 18 is sent to control unit 19. Control unit 19 compares the measured value with the required value and judges the time for cleaning the inside of the etching chamber. Control unit 19 also controls vacuum transport units 13 and 14, thus controlling the transfer of dummy wafers 30 between cassette 1c and etching chamber 11a or 11b.

In the vacuum processing apparatus thus configured, first, cassettes 1a and 1b containing unprocessed wafers are placed on cassette tables 2a and 2b, respectively, by a line transport robot that operates in accordance with the information received from a host control unit, or by the operator, whereas cassette 1c containing dummy wafers is placed on cassette table 2c. The processing apparatus conducts wafer processing or plasma cleaning, pursuant to either self-identification of the production information assigned to cassette 1a or 1c, the information received from the host control unit, or the instruction entered by the operator.

For example, vacuum transport units 13 and 14 carry wafers 20, in order from bottom to top, from cassette 1a to etching chambers 11a and 11b, where the wafers then undergo etching. After etching, wafers 20 are returned to their original positions within cassette 1a by vacuum transport units 13 and 14. In this case, without changing the position and direction of each wafer during the time from the start of operation to the end, the transport units take out unprocessed wafers and return only processed ones to the positions where they were stored before being processed. Thus, application to automatic operation of semiconductor manufacturing equipment becomes easy and the contamination of wafers with dirt can be minimized and high production efficiency and high production yields can be achieved.

As etching progresses in the etching chamber 11a or 11b, reaction products stick to and accumulate on the inner wall of the etching chamber. The reaction products must therefore be removed by plasma cleaning to restore the inside of the etching chamber to its original status. The time to conduct plasma cleaning is judged by control unit 19. In this case, since etching chamber 11a or 11b has a portion to which plasma light penetrates, the luminous intensity of the plasma light immediately after it has penetrated is measured by sensor 18 and when the measured luminous intensity reaches a required value, control unit 19 judges that the time for plasma cleaning has been reached. Or, control unit 19 can be activated to count the number of wafers which have been processed in the etching chamber, and when the measured luminous intensity reaches the required value, the time for plasma cleaning can be judged to have been reached. Actual plasma cleaning can be conducted either during the processing of the required number of wafers within cassette 1a or 1b, or before wafer processing control is advanced to the next cassette following completion of processing of all wafers 20.

The sequence of plasma cleaning is described hereunder. This sequence applies when two dummy wafers 30 of all those (in this case, 25 wafers) stored within cassette 1c are processed in etching chamber 11a or 11c.

The first unused or reusable dummy wafer 30 within cassette 1c is picked by transport unit 13. Although any dummy wafer stored within cassette 1c can be picked at this time, the position numbers and usage counts of all dummy wafers within the cassette are already stored into memory to ensure that the wafers are always taken out in order with the lowest-usage-count wafer first. After the first wafer has been picked, it is carried into loading lock chamber 6a located at the opposite side to that of cassette 1a, via gate valve (isolated valve) 12a by transport unit 13 in the same way it transports wafer 20 for etching. Loading lock chamber 6a, after closing gate valve 12a, is vacuum-exhausted down to the required vacuum pressure by vacuum exhaust unit 3, then gate valve 12b and gate valve (isolated valve) 15a are opened, and dummy wafer 30 is carried from loading lock chamber 6a to etching chamber 11a via vacuum transport chamber 16 by transport unit 14. Subsequently, dummy wafer 30 is placed on samples mount 8a. After closing gate valve 15a, etching chamber 11a with the dummy wafer mounted inside provides plasma cleaning under the required conditions.

During this time, loading lock chamber 6a closes gate valves 12a and 12b and is then returned to the original atmospheric pressure by gas induction unit 4. Next, loading lock chamber 6a opens gate valve 12a and carries dummy wafer 30 into loading lock chamber 5a by transport unit 13 in the same way the first dummy wafer 20 was carried. After closing gate valve 12a, loading lock chamber 6a is vacuum-exhausted down to the required vacuum pressure by vacuum exhaust unit 3 again, then gate valve 12b and gate valve (isolated valve) 15b are opened, and the second dummy wafer 30 is carried from loading lock chamber 6a to etching chamber 11b via vacuum transport chamber 16 by transport unit 13. Subsequently, gate valve 15b is closed and then the dummy wafer is provided with plasma cleaning.

After plasma cleaning of etching chamber 11a containing the first dummy wafer 20 has been completed, gate valves 15a and 12c are opened. Used dummy wafer 30 is carried out from etching chamber 11a into unloading lock chamber 6b by transport unit 14, and following this process, gate valve 12c is closed. Subsequently, unloading lock chamber 6b is returned to the original atmospheric pressure by gas induction unit 4 and then gate valve 12d is opened. Used dummy wafer 30 that has been carried out into unloading lock chamber 6b is taken out into the atmosphere via gate valve 12d by transport unit 13 and then returned to the original position within cassette 1c.

After plasma cleaning of etching chamber 11b, the second dummy wafer 20 is likewise returned to the original position within cassette 1c.

In this manner, used dummy wafers 30 are returned to the original positions within cassette 1c and this cassette is always stocked with dummy wafers 30. After all dummy wafers 30 within cassette 1c have undergone plasma cleaning or have been reused several times to reach the scheduled usage count, all these dummy wafers 30 and cassette 1c are replaced together. The replacement timing of this cassette is controlled by control unit 19 and the appropriate instruction signal is sent to the host control unit that controls the line transport robot, or to the operator.

The above description of plasma cleaning applies to continuous plasma cleaning of etching chamber 11a or 11b using only any two of all dummy wafers 30 stored within cassette 1c. Other processing methods, however, can also be used.

For example, etching chambers 11a or 11b can likewise be provided with plasma cleaning sequentially using one dummy wafer 30. In this example of plasma cleaning, unprocessed wafer 20 in an etching chamber other than that which is to undergo plasma cleaning can be provided with etching and the apparatus can be cleaned without the etching process being interrupted.

In another example of a plasma cleaning method in which an etching chamber, a post-processing chamber, a film-forming chamber, and other types of processing chambers are to be used and wafers are sequentially sent to each such chamber for processing, dummy wafers 30 can also be sent during sequential processing of wafers 20 stored within cassette 1a or 2a, and these dummy wafers 30 are merely passed through a processing chamber not requiring plasma cleaning. In this case, dummy wafers 30 are processed only after arriving at the processing chambers that require plasma cleaning, whereby the corresponding processing chambers can be provided with plasma cleaning as appropriate.

According to these embodiments, a cassette containing dummy wafers and a cassette containing the wafers to be processed can be arranged together in the atmosphere, then only dummy wafers are loaded from the cassette into the apparatus during the cleaning process by activating the same transport unit as that used for carrying the wafers to be processed, and after plasma cleaning, used dummy wafers can be returned to their original positions within the cassette. The adoption of this method makes it unnecessary to provide a special mechanism for plasma cleaning and thus enables the apparatus to be simplified. Also, plasma cleaning does not need to be handled as a special processing sequence, and this cleaning process can be incorporated into normal etching to perform a series of operations efficiently.

In addition, since plasma-cleaned dummy wafers are automatically returned to their original positions within the cassette placed in the atmosphere, used dummy wafers are not placed in mixed form with unprocessed or processed wafers in the vacuum chamber. Unlike conventional apparatuses, therefore, the apparatus based on the present invention does not cause wafer contamination with dirt or residual gases.

Furthermore, since used dummy wafers are not only automatically returned to their original positions within the cassette, but also controlled in terms of usage count, it is possible to avoid confusion between used dummy wafers, unused dummy wafers, dummy wafers low in usage count, and dummy wafers high in usage count, and thus to use each dummy wafer efficiently and without inconvenience during plasma cleaning.

Furthermore, a plurality of processing chambers are provided, wafers and their dummies can be carried using the same transport unit, and the control unit controls the cleaning timing of each processing chamber to enable timely plasma cleaning. These, in turn, enable arbitrary cleaning time period setting, dry cleaning without interruption in the flow of processing, and efficient processing for improved production efficiency.

In a configuration as described above, the axial line passing through the middle of the vacuum transport chamber and the locking unit is taken as line A; the axial line passing through the middle of the vacuum transport chamber and that of etching chamber 11a is taken as line B; and the axial line passing through the middle of the vacuum transport chamber and that of etching chamber 11b is taken as line C.

Etching chambers 11a and 11b, which are vacuum processing chambers for processing wafers, are both formed by a UHF-ECR reactor. Two such chambers are provided only at the opposite side to that of the locking unit across vacuum transport chamber 16, symmetrically with respect to axial line A passing through the middle of vacuum transport chamber 16 and locking unit 6. Also, the foregoing two etching chambers, 11a and 11b, are arranged at the acute angle, alpha, formed by lines B and C, and at the opposite side to that of vacuum transport chamber 16, and atmospheric loader 1, vacuum loader 7, and locking unit 6 are arranged in T-shaped form.

Figure 4:
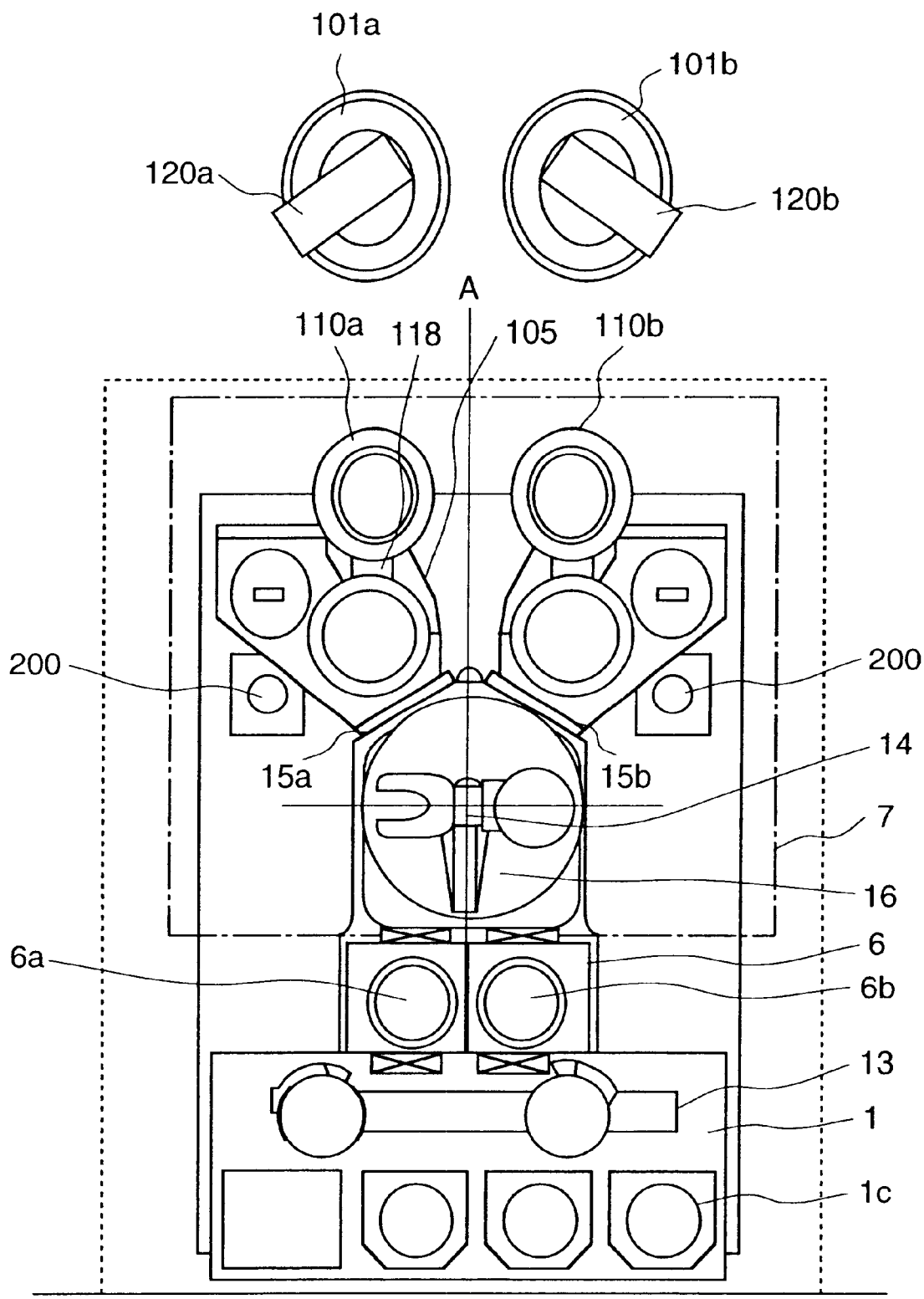
FIG. 4 is a diagram showing one maintenance mode of the apparatus shown in FIG. 2.

As shown in FIG. 4, UHF-ECR antennas 110a and 110b are parallel to the abovementioned axial line A and are opened at the opposite side to that of the vacuum transport chamber. The structure of the antennas is described hereunder.

Prior to antennas 110a and 110b being opened, magnetic field generating units 101a and 101b used in etching chambers 11a and 11b, respectively, and antenna power lines 120a and 120b are lifted off by lifting unit 200. Other components of the antenna sections are detailed hereunder. Also, see FIG. 8.

The procedures for disassembling and reassembling the apparatus based on embodiments of the present invention, and the methods of removing the components of the apparatus will be described hereunder with reference to FIGS. 5 to 7.

Figure 5:
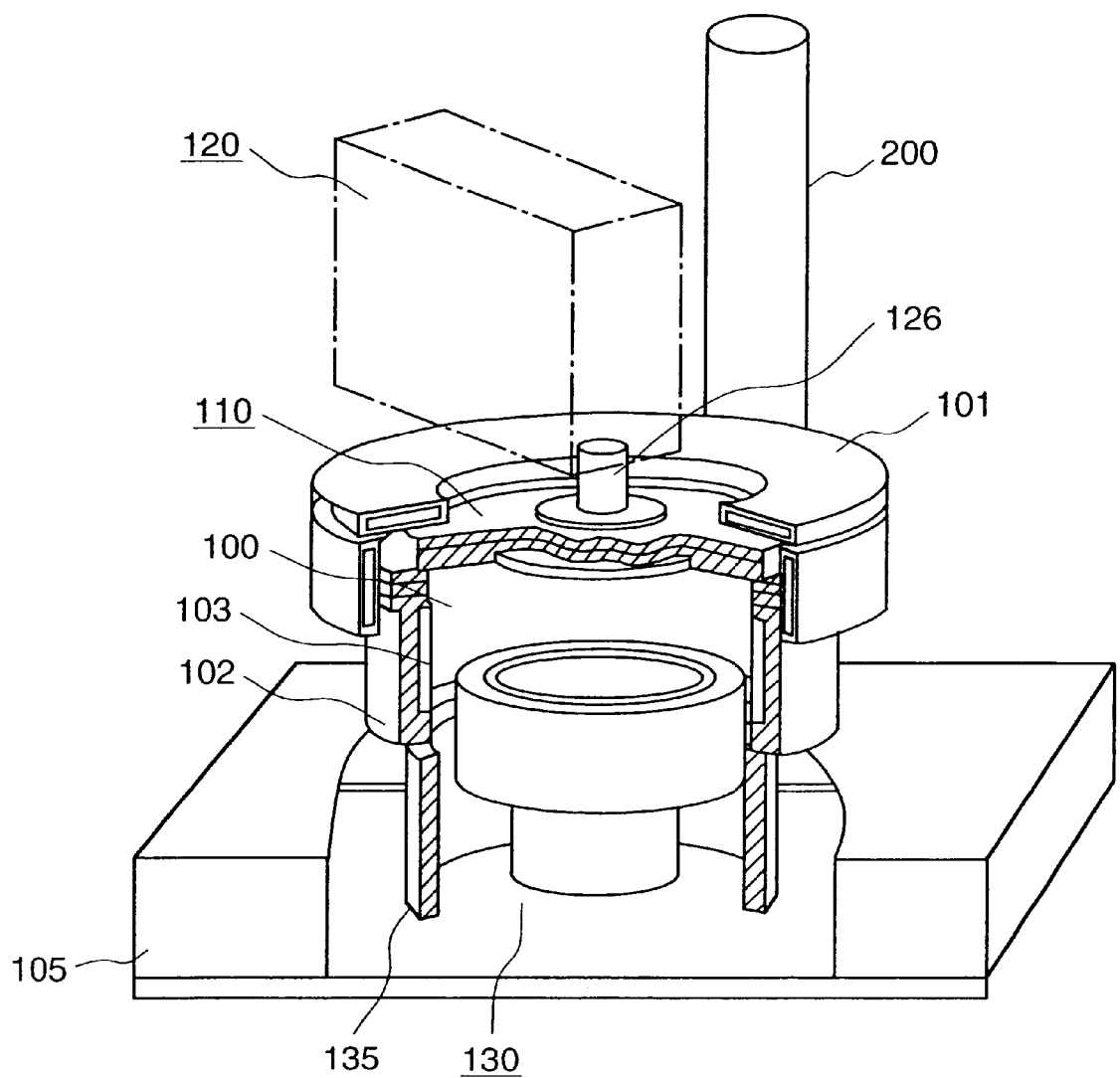
FIG. 5 is cutaway perspective view showing the maintenance status of one plasma etching apparatus according to the present invention.

FIG. 5 is a perspective view of the main section of the plasma etching apparatus, with part thereof being shown in cross section in order to represent the maintenance status based on the present invention. Above the side wall 102 mounted on vacuum chamber 105 there is installed an antenna 110, around which a magnetic field generating unit 101 is installed, and antenna power line 120 is connected to antenna 110 via lead-in terminal 126.

For apparatus disassembly during wet cleaning, processing chamber 100 and vacuum chamber 105 are exposed to the atmosphere, and lead-in terminal 126 that connects the antenna 110 to the antenna power line 120 is disconnected.

Figure 6:
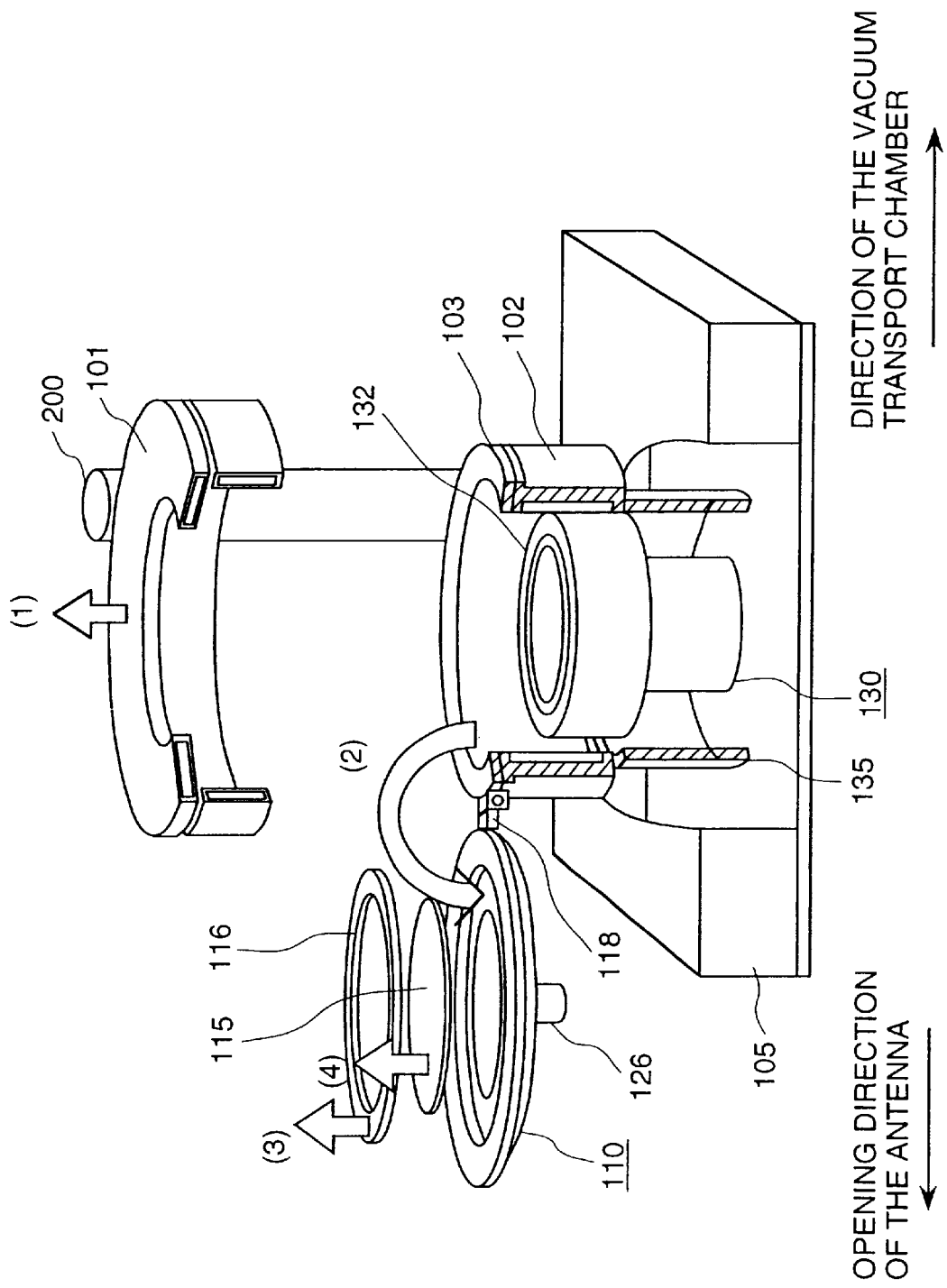
FIG. 6 is a cutaway perspective view showing the maintenance status of another plasma etching apparatus according to the present invention.

The next step is shown in FIG. 6. First, as indicated by arrow (1) in FIG. 6, magnetic field generating unit 101 and antenna power line 120 (not shown) are lifted by lifting unit 200 and then are fixed at a position that facilitates maintenance. Next, as indicated by arrow (2), antenna 110 is opened by being rotated about the shaft of hinge 118 until the antenna is disposed in an almost horizontal position, and then plate 115 and ring 116 are lifted off as indicated by arrows (3) and (4). In this case, as shown in FIG. 4, antenna 110 is rotated and held at the operator side, which is the opposite side to that of vacuum transport chamber 16.

Figure 7:
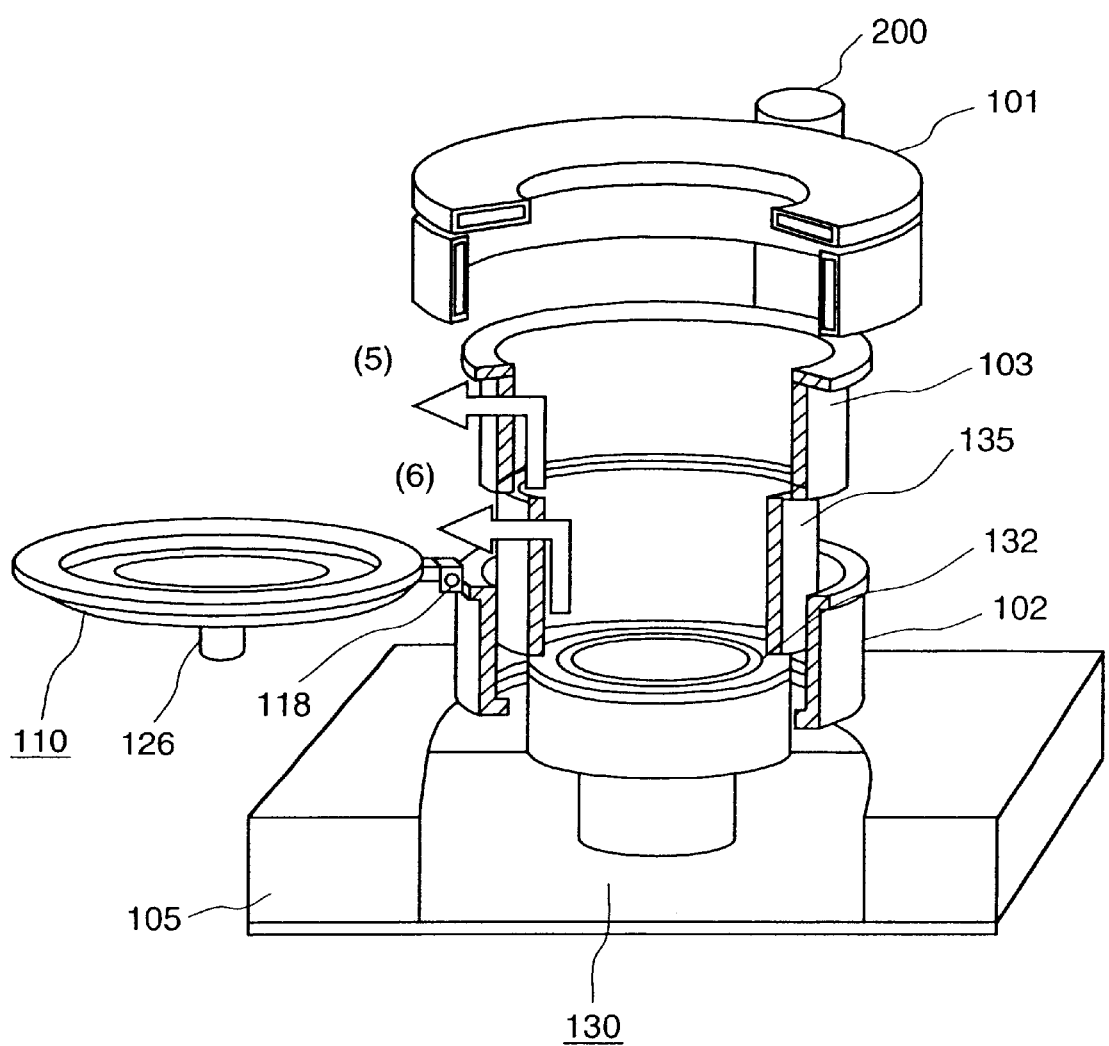
FIG. 7 is a cutaway perspective view showing the maintenance status of still another plasma etching apparatus embodied according to the present invention.

The next step is shown in FIG. 7. As indicated by arrows (5) and (6), side wall inner unit 103 and bottom cover 135 are lifted off.

Also, focus ring 132 of the bottom electrode is removed. Removed components are subjected to processing, such as removal of film deposits, ultrasonic cleaning, and drying. Subsequently, all removed components are reinstalled using the reverse procedure to that described above. Next, the apparatus is restored to the original status and then undergoes vacuum evacuation.

Subsequently, the arrival of processing chamber 100 at the required vacuum pressure is confirmed, and then, as required, foreign substance checks and rate checks are performed. After normal operation of the apparatus has been confirmed, it is restored to the intended operational status and wet cleaning is completed. With one complete set of available replacement components at hand, since immediate restoration and vacuum evacuation of the apparatus is possible, its downtime (Good Wafer to Good Wafer) can be minimized.

Furthermore, improvement of wet cleaning efficiency by the adoption of an appropriate measure, such as using no bolts in the sealed areas or connections of the vacuum flange section, reduces apparatus downtime to about three to four hours, thus maximizing apparatus availability.

In this embodiment, as shown in FIG. 6, since antenna. 110 can be opened by rotating it about the shaft of hinge 118, the entire antenna does not need to be removed by lifting it from the processing chamber, nor are any burdens of lifting heavy objects imposed on maintenance personnel. Also, since antennas 110a and 110b are rotated and held in the same direction, both antennas can be easily serviced and do not interfere with one another, with the result that their arrangement is smooth and effective use of their spaces is possible. As already described, since plate 115 and ring 116 can also be easily removed just by lifting them in the directions of arrows (3) and (4), the maintenance efficiency can be improved and the likelihood of components being damaged is reduced.

Figure 8:
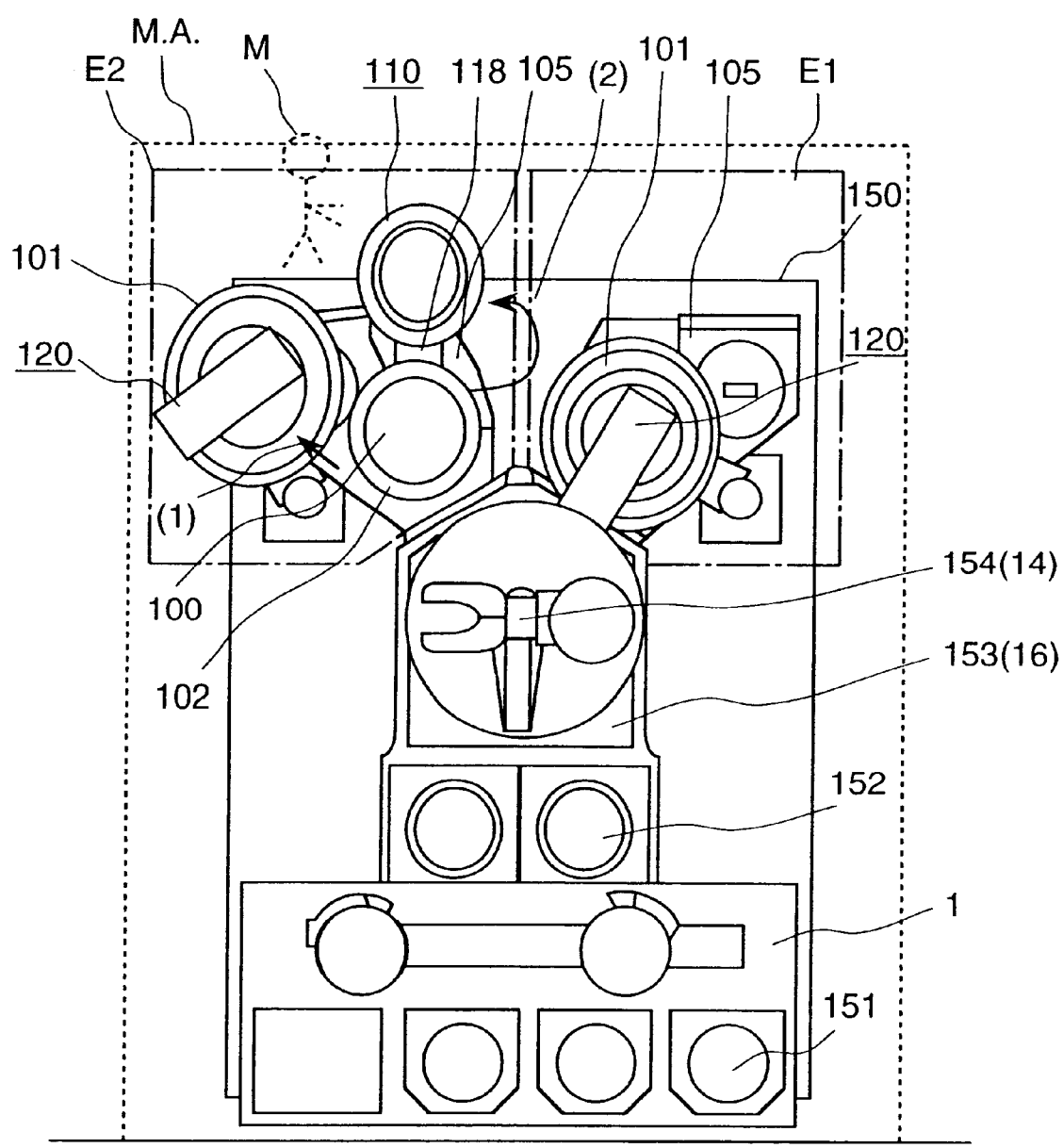
FIG. 8 is a diagram showing an embodiment of the present invention where the full-flat open-structured vacuum vessel is mounted in a plasma processing system.

FIG. 8 is a top plan view of a full-flat open-structured vacuum vessel, as seen when it is mounted in a plasma processing system according to another embodiment of the present invention. This system has two plasma processing chambers, E1 and E2, and wafer samples are carried from loader mechanism 151 through loading lock chamber 152 to buffer chamber 153, and the samples are then transferred from sample transport mechanism 154 to plasma processing chambers E1 and E2.

In FIG. 8, the status of plasma processing chamber E1, as it appears when system assembly is completed, is shown, and magnetic field generating unit 101 and antenna power line 120 are mounted above vacuum chamber 105. Likewise, plasma processing chamber E2 during wet cleaning is shown, in which case, the inside of processing chamber 100 is exposed to the atmosphere and antenna 110 is opened by hinge 118 to take a fully flat state. Magnetic field generating unit 101 and antenna power line 120 are moved away to a position that facilitates maintenance. Maintenance personnel M present in the maintenance area can easily perform maintenance operations because antenna 110 is opened in the direction of the maintenance personnel M (namely, outward with respect to base frame 150 of the system) and is about half protruded with respect to base frame 150. This antenna is not projected too far, nor does it occupy a superfluous space in the maintenance area. It becomes possible, by mounting a plasma processing chamber (reactor) of full-flat open structure in this way, to implement a plasma processing system well balanced between total configurational compactness and maintainability.

Although, in FIG. 8, magnetic field generating unit 101 is as shown protruding from the system area, this unit actually does not protrude outward after it has been moved away in the upward direction of plasma processing chamber E2.

Referring again to FIG. 1, in the foregoing configuration, two etching chambers are provided only at the opposite side to that of the locking unit across the vacuum transport chamber, symmetrically with respect to the axial line passing through the middle of the vacuum transport chamber and the locking unit, and the foregoing two vacuum processing chambers are arranged at an acute angle, at the opposite side to that of the vacuum transport chamber, and in linear form along line D in all vacuum chambers of the vacuum processing apparatus. Line D is parallel to line E that connects the centers of the vacuum transport chambers. Under such arrangement of the vacuum processing apparatus components, since the antennas are opened in a vertical direction relative to lines D and E, even when the adjacent vacuum processing chambers of the vacuum processing apparatus are exposed to the atmosphere at the same time, a sufficient maintenance space is ensured, compared with the case in which the antennas are opened in the direction from the vacuum transport chamber toward the vacuum processing chambers.

According to the present invention, it is possible to minimize increases in manufacturing costs, while at the same time providing flexibility to increases in sample size, and to provide a vacuum processing apparatus that has excellent maintainability. Also, incorporation of such vacuum processing apparatus into semiconductor manufacturing equipment makes it possible to ensure the complement of vacuum processing apparatus and minimize manufacturing costs while at the same time providing flexibility to increases in sample size, and to supply semiconductor manufacturing equipment whose maintainability does not deteriorate.

Furthermore, according to the present invention, one portion of the vacuum vessel constituting the processing chambers can be constructed as a section that can be opened and closed, and when this section directs the processing chambers upward, components can be maintained in their physically stable status at the operator side in an almost horizontal position by friction or by a securing section. Accordingly, since the top of the processing chambers opens in the direction of the maintenance area, maintenance personnel can easily both access the processing chambers and perform maintenance operations from the top. As a result, the maintenance personnel can easily handle components during maintenance and maintainability is improved, which in turn enables the realization of a plasma processing apparatus which has excellent maintainability, is easy to use and contributes to an improvement in productivity.

What is claimed is:

1. Vacuum processing apparatus comprising:

a plurality of cassette tables arranged close to each other, an atmospheric transport unit for carrying wafers from or to said cassette tables, a plurality of vacuum processing chambers, a vacuum transport chamber communicated with said vacuum processing chambers, and loading and unloading lock chambers equipped with gate valves for connecting said atmospheric transport unit and said vacuum transport chamber;

wherein each of said vacuum processing chambers has side wall inner units and antennas so mounted as to permit disassembly, and said plurality of vacuum processing chambers are arranged symmetrically with respect to an axial line passing through the middle of the vacuum transport chamber and lock chambers, only at the opposite side of the lock chamber across the vacuum transport chamber, and in such a manner that the vacuum processing chambers form an acute angle with respect to the vacuum transport chamber, wherein said antennas are directed almost in parallel to said axial line, and each of said antenna is opened in almost horizontal position at the opposite side of said vacuum transport chamber.

* * * * *